United States Patent [19]

Gritton

[11] Patent Number: 4,574,166

[45] Date of Patent: Mar. 4, 1986

[54] TANDEM ADAPTIVE FILTER ARRANGEMENT

[75] Inventor: Charles W. K. Gritton, North Brunswick, N.J.

[73] Assignee: AT&T Bell Laboratories, Murray Hill, N.J.

[21] Appl. No.: 464,029

[22] Filed: Feb. 4, 1983

[51] Int. Cl.$^4$ .............................................. H04B 3/20
[52] U.S. Cl. ................................................. 179/170.2
[58] Field of Search .................... 179/170.2, 170.6; 333/18, 166; 364/724

[56] References Cited

U.S. PATENT DOCUMENTS

| | | | |
|---|---|---|---|
| 3,732,410 | 5/1973 | Mackechnie | 179/170.2 X |
| 3,787,645 | 1/1974 | Ochiai et al. | 179/170.2 |
| 3,828,147 | 8/1974 | Ochiai et al. | 179/170.2 |
| 4,377,793 | 3/1983 | Horna | 333/165 |

OTHER PUBLICATIONS

"Extended Range Echo Cancellers" by O. A. Horna, IEEE Southeastcon 1981 Conference Proceedings, pp. 846–853.

*Primary Examiner*—Gene Z. Rubinson
*Assistant Examiner*—R. Vaas
*Attorney, Agent, or Firm*—Thomas Stafford

[57] ABSTRACT

An extended impulse response characteristic is obtained by connecting a plurality of adaptive echo cancelers in a tandem connection (FIG. 1 or FIG. 2). Delay units (102) are associated with receive inputs (X) of the adaptive echo cancelers (101, FIG. 1, or 201 FIG. 2) so that each canceler models a predetermined fixed portion of the extended impulse response characteristic. The relative positions of the cancelers in the tandem connection are controllably switched (via 103-0 through 103-(N-1) and (104) at a predetermined rate (via 105) to insure so-called "good" adaptation of the individual adaptive echo cancelers. In one embodiment, the adaptive echo canceler in a preferred position in the tandem connection is allowed to adapt at its normal rate while the other cancelers are inhibited (via $\overline{\text{INH}}$) from adapting. In another embodiment, the adaptive echo canceler in the preferred position is allowed to adapt at the normal rate while the other cancelers are allowed to adapt at slower rates (via GAIN) determined in accordance with their relative positions in the tandem connection.

13 Claims, 2 Drawing Figures

TANDEM ADAPTIVE FILTER ARRANGEMENT

TECHNICAL FIELD

This invention relates to adaptive filters and, more particularly, to a tandem adaptive filter arrangement for obtaining an extended impulse response characteristic.

BACKGROUND OF THE INVENTION

Adaptive filters operate on an incoming signal to generate an impulse response characteristic in accordance with a prescribed algorithm. Existing adaptive filters, for example, those used as echo cancelers are able to model an impulse response of a limited interval, for example, 16 milliseconds. In some applications, it is desirable to model an impulse response having an interval greater than the available interval of an individual adaptive filter or echo canceler. One example, is in applications where the round trip electrical delay encountered in a telephone transmission channel is greater than the impulse response interval of an individual echo canceler. Another example, is in applications for addressing acoustic delays where the impulse response needed can be extremely long.

One solution to the long electrical delay problem is to use a "truly" cascadable adaptive echo canceler. In such an arrangement, each canceler uses a common error signal to update the impulse response estimate being generated. In order to do this, the individual adaptive cancelers must be arranged circuit wise to facilitate inputting the common error signal to the impulse response updating circuitry. Such a truly cascadable echo canceler including an adaptive filter is manufactured by Western Electric Company. However, most presently available echo cancelers do not have this capability. Moreover, only a limited number of these truly cascadable echo cancelers can be cascaded and, therefore, their use is essentially limited to addressing the long electrical delays and not the extremely long acoustic delays.

One attempt at using available echo cancelers to obtain an extended impulse response characteristic is disclosed in copending U.S. patent application Ser. No. 464,054, filed concurrently herewith. In the disclosed arrangement, two adaptive echo cancelers are arranged in tandem and their relative positions in the tandem connection are controllably switched in order to improve the overall adaptation to a desired extended impulse response. One problem with this arrangement is that it must be determined when to switch the cancelers. Another problem is that ON-HOOK, OFF-HOOK information is needed to initiate and reset the canceler adaptation process. This type of information is not usually available for echo canceler applications. Moreover, because of the need to determine when to switch the cancelers, this arrangement is not readily expanded beyond the two adaptive echo canceler applications. Thus, although this tandem arrangement may be satisfactory for some applications, it is not for others, for example, the canceling of an acoustic echo and where ON-HOOK, OFF-HOOK information is not readily available.

SUMMARY OF THE INVENTION

An extended impulse response characteristic is obtained by switchably connecting a plurality of adaptive echo cancelers in tandem. The relative positions of the individual adaptive cancelers in the tandem connection are controllably switched, in accordance with an aspect of the invention, so that each of the adaptive cancelers is connected in a prescribed sequence in a so-called preferred position in the tandem connection. The adaptive canceler in the preferred position is enabled to adapt at a so-called normal rate while the adaptation rates of the other adaptive cancelers are controllably set, in accordance with an aspect of the invention, to predetermined rates less than the normal rate of adaptation. In accordance with another aspect of the invention, the relative positions of the adaptive cancelers in the tandem connection are switched continuously at a predetermined rate. In accordance with still another aspect of the invention, the adaptive canceler in the preferred position is enabled to adapt at the normal rate while the other adaptive cancelers are inhibited from adapting. In accordance with yet another aspect of the invention, the adaptive canceler in the preferred position is enabled to adapt at the normal rate while the other adaptive cancelers are controlled to adapt at predetermined rates less than the normal rate determined in accordance with the relative positions of the individual adaptive cancelers in the tandem connection.

In one embodiment of the invention, the plurality of adaptive cancelers are switchably connected in a so-called ring configuration and each of the adaptive cancelers has a predetermined delay associated with a receive input so that each adaptive canceler models a different portion of the desired extended impulse response characteristic. A zero delay is typically associated with one of the adaptive cancelers. Transmit inputs and outputs of the adaptive cancelers are switchably connected so that the relative positions of the adaptive echo cancelers in the ring configuration are controllably switched in a prescribed sequence at a predetermined rate while the portion of the extended impulse response characteristic that each canceler models remains fixed. The adaptive canceler in the so-called preferred position of the ring configuration is enabled to adapt at a normal rate while the other adaptive cancelers are either inhibited from adapting or permitted to adapt at rates less than the normal rate determined in accordance with the relative position of the adaptive canceler in the ring configuration. The ring configuration is such that a received signal is supplied via the delay units to receive inputs of the adaptive cancelers while a transmit signal is supplied to the transmit input of the "last" adaptive canceler in the ring configuration. An output from a transmit output of the last canceler is supplied to the transmit input of the next to last canceler in the ring configuration and so on until the signal to be transmitted, i.e., the adaptive echo canceler error signal, is outputted from a transmit output of the first canceler, i.e., the canceler in the preferred position, in the ring configuration.

BRIEF DESCRIPTION OF THE DRAWING

The invention will be more fully understood from the following detailed description of embodiments thereof taken in conjunction with the appended figures in which.

DETAILED DESCRIPTION

Figure 1:
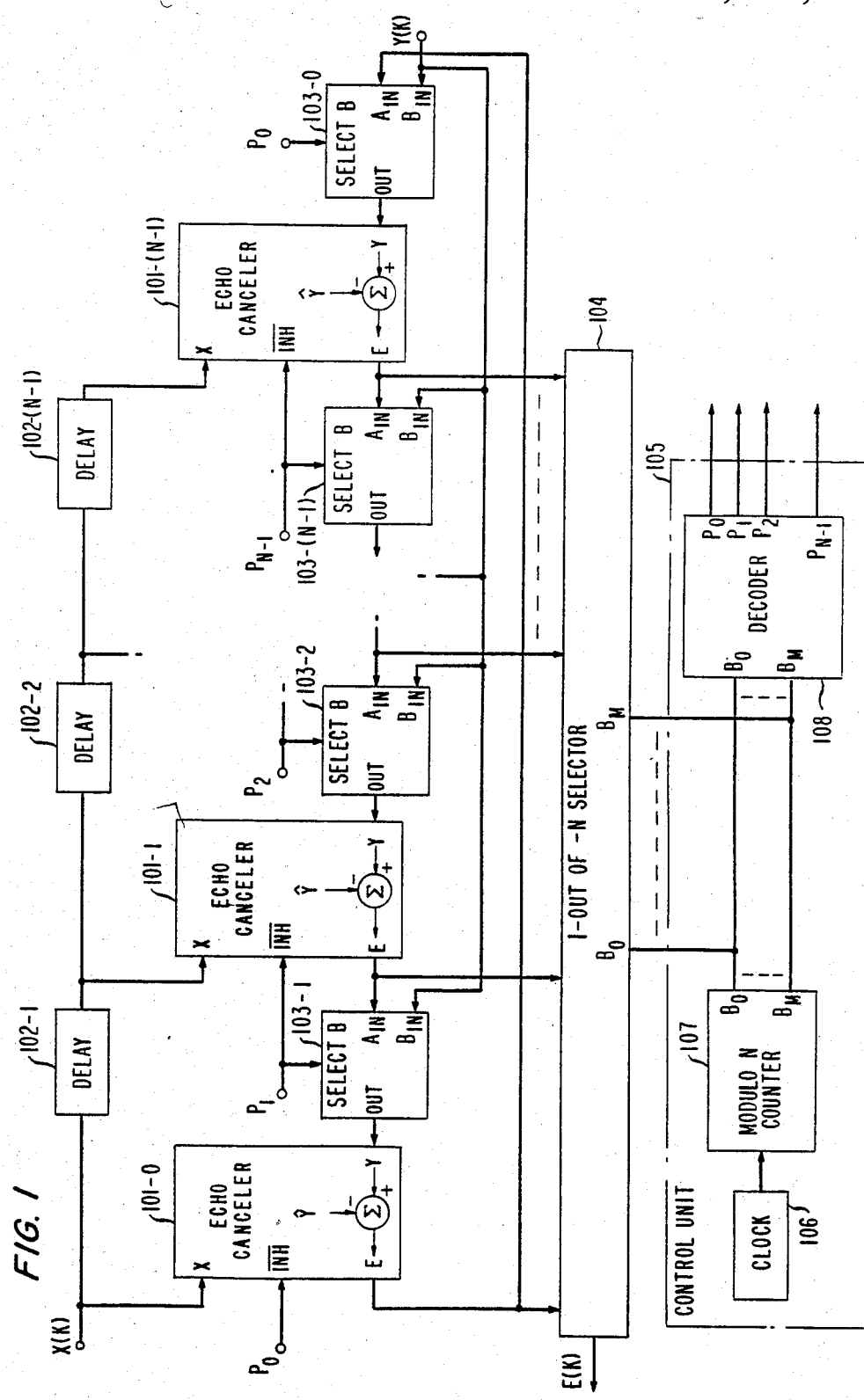
FIG. 1 shows in simplified block diagram form a tandem connection of adaptive echo cancelers including one embodiment of the invention.

FIG. 1 illustrates in simplified block diagram form one embodiment of the invention. Accordingly, a received signal X(K) is supplied to a receive input (X) of adaptive echo canceler 101-0 and via delay units 102-1 through 102-(N-1) to receive inputs X of adaptive echo cancelers 101-1 through 101-(N-1), respectively. Adaptive echo cancelers 101 may be any one of a number known in the art. In this example, echo cancelers 101 each include an adaptive transversal filter and are of a type broadly disclosed in U.S. Pat. No. 3,500,000 and described in an article by D. L. Duttweiler and Y. S. Chen entitled, "A Single-Chip VLSI Echo Canceler", *The Bell System Technical Journal*, Vol. 59, No. 2, February 1980, pages 149–160. Briefly, each of adaptive echo cancelers 101 has a receive input (X), transmit input (Y), a transmit output (E), update inhibit input ($\overline{INH}$) and/or an update gain adjustment input (GAIN) (see FIG. 2). The adaptive echo cancelers operate in known fashion to generate a signal estimate $\hat{Y}$ which is algebraically combined with a signal supplied to transmit input Y to generate an error signal at the transmit output E. The error signal is used internally in the adaptive echo canceler to update the tap coefficient values in order to better model the impulse response characteristic being generated and drive the error signal toward a zero value.

Delay units 102-1 through 102-(N-1) are employed to fix the portion of the desired extended impulse response characteristic that each of adaptive echo cancelers 101-0 through 101-(N-1) generates. The delay interval of each of delay units 102 is dependent on the number of coefficient taps (Z) in adaptive echo cancelers 101 and the sampling interval K being employed. Typically, each of delay units 102 includes a shift register having Z stages and being clocked at the sampling rate $K^{-1}$. In one example, the number of taps (Z) is 128 and the sampling rate ($K^{-1}$) is 8 kHz. Thus, adaptive echo cancelers 101-0 typically has a zero delay and models a first fixed portion of the extended impulse response, for example, a 16 millisecond interval. Adaptive echo cancelers 101-1 has one delay unit, namely, delay 102-1, associated with its receive input (X) and, consequently, models a second fixed portion of the extended impulse response characteristic, for example, an interval from 16 to 32 milliseconds. The next one of adaptive echo cancelers, namely 101-2, in the tandem connection has two of delay units 102 associated with its receive input and generates a third fixed portion of the extended impulse response and so on through the last adaptive echo canceler, namely 101-(N-1) in the tandem connection which has (N-1) delay units associated with its receive input and models an $N^{th}$ fixed portion of the extended impulse response characteristic.

Adaptive echo cancelers 101-0 through 101-(N-1) are switchably connected in a so-called ring configuration via controllable selector units 103-0 through 103-(N-1) and 1-out of-N selector unit 104. As shown, the transmit output (E) of each of adaptive echo cancelers 101-0 through 101-(N-1) is connected to the $A_{IN}$ input of an associated one of selector units 103-0 through 103-(N-1), respectively, and to 1-out of-N selector unit 104. A signal to be transmitted, for example, Y(K), is supplied to a $B_{IN}$ input of each of selector units 103-0 through 103-(N-1). Signal Y(K) is, for example, the signal to be transmitted in an echo canceler application including near-end speech and the echo signal to be cancelled or an arbitrary system signal in an adaptive filter application. The output from each of selector units 103-0 through 103-(N-1) is normally the $A_{IN}$ input and is the $B_{IN}$ input when enabled by a true, i.e., logical 1, signal being supplied to the select B input from control unit 105.

Selector units 103 as shown assume no delay in the transmit input to transmit output path in adaptive echo cancelers 101. If there are delays in the transmit input to transmit and output path, appropriate delays need to be included in 1-out of-N selector unit 104 and selector units 103 to eliminate any resulting transients caused by instantaneously switching the relative positions of adaptive echo cancelers 101 in the tandem connection.

Control unit 105 operates to generate signals for controlling the sequential switching at a continuous predetermined rate of the relative positions of adaptive echo cancelers 101-0 through 101-(N-1) in the tandem connection, in accordance with an aspect of the invention. To this end, control unit 105 includes clock 106, modulo N counter 107 and decoder 108. Clock 106 generates a clock signal at a predetermined rate, for example, at a 10 Hz rate. The clock signal is supplied to modulo N counter 107 which, in turn, generates binary output bits $B_0$ through $B_M$ which are representative of binary 0 through (N-1) in sequence at the predetermined clock rate. In one example, when the invention is employed to cancel a long electrical echo, N equals 4 and M equals 1. In another example, when the invention is employed to cancel an acoustic echo, N equals 8 and M equals 2. Binary bits $B_0$ through $B_M$ are supplied to 1-out of-N selector 104 for controlling which one of the transmit outputs (E) of adaptive echo cancelers 101 is to be outputted as the desired tandem adaptive echo cancelers output E(K) in the prescribed sequence at the predetermined clock rate. Binary bits $B_0$ through $B_M$ are also supplied to decoder 108 which, in turn, generates control signals $P_0$ through $P_{N-1}$. Decoder 108 is operative to generate a true output, i.e., representative of a logical 1, in sequence at outputs $P_0$ through $P_{N-1}$ at the predetermined continuous rate. Only one of outputs $P_0$ through $P_{N-1}$ is true at any instant while the remaining outputs are false, i.e., representative of a logic 0. Outputs $P_0$ through $P_{N-1}$ are supplied to the inhibit inputs ($\overline{INH}$) of adaptive echo cancelers 101-(N-1), respectively, and to the select B inputs of selector units 103-0 through 103-(N-1), respectively. Since only one of control signals $P_0$ through $P_{N-1}$ is true during any clock interval; only one of adaptive echo cancelers 101 is enabled to adapt, in accordance with an aspect of the invention, while the others of adaptive echo cancelers 101 are inhibited from adapting. Additionally, the enabled one of adaptive echo cancelers 101 is connected in a so-called preferred position, i.e., a first position, in the tandem connection by the corresponding one of selector units 103 being enabled to supply transmit signal Y(K) to the transmit input (Y) of the last one of adaptive echo cancelers 101 in the tandem connection and 1-out of-N selector in response to binary bits $B_0$-$B_M$ selecting the transmit output (E) of the one of adaptive echo cancelers 101 in the first position as output E(K).

By way of example, in a given clock interval assume $P_0$ is true and corresponding binary bits $B_0$-$B_M$ are representative of binary 0. Then, adaptive echo canceler 101-0 is enabled to adapt at a so-called normal rate while the other adaptive echo cancelers, namely, 101-1 through 101-(N-1) are inhibited from adapting, and transmit output E from adaptive echo canceler 101-0 is selected by selector 104 as output E(K). The normal rate of adaption is a rate obtained by setting the tap coefficient update gain value so that good quality adaption would result if the adaptive echo canceler was being used in a non-tandem application. In one example, the normal rate of adaption is set at −50 dB/second. That is to say, the decreasing slope of error signal E of adaptive echo cancelers 101 during the initial portion of the adaptation process is 50 dB/second in power. Selector unit 103-0 is also enabled via $P_0$ to supply Y(K) to the transmit input (Y) of the last adaptive echo cancelers in the tandem connection, namely, 101-(N-1). Additionally, the transmit output E from adaptive echo canceler 101-(N-1) is supplied via selector unit 103-(N-1) to the transmit input of the next to last one of adaptive echo cancelers 101 in the tandem connection, namely, 101-(N-2) and so on until the transmit signal modified by echo cancelers 101-1 through 101-(N-1) is supplied to the transmit input of the first adaptive echo canceler in the tandem connection, namely, 101-0. During the next clock interval $P_1$ is true and binary bits $B_0$-$B_M$ are representative of binary 1 and, consequently, adaptive echo canceler 101-1 is switched to the first or preferred position in the tandem connection and adaptive echo canceler 101-1 is switched to the last position in the tandem connection. Thus, the relative positions of adaptive echo cancelers 101 in the tandem connection are controllably switched in the prescribed sequence and at the predetermined continuous rate so that each one of adaptive echo cancelers 101 is connected in the first or preferred position in the prescribed sequence. It is noted that since the switching occurs in the transmit inputs and outputs of adaptive echo cancelers 101 and since delay units 102 are connected in circuit relationship with the echo canceler receive inputs, the portion of the desired extended impulse response that each of the adaptive filters 101-0 through 101-(N-1) models remains fixed. Furthermore, since each of adaptive echo cancelers 101-0 through 101-(N-1) including its corresponding receive input delay is switched to the first position in the connection, it is insured that the impulse response being modeled will correspond to the arbitrary system or that an appropriate estimate of either an electrical or acoustic echo signal to be cancelled will be generated.

Again, the reason for switching the relative positions of adaptive echo cancelers 101-0 through 101-(N-1) in the tandem connection is to insure "good" adaptation of the individual ones of adaptive echo cancelers 101 and, thereby, minimizing so-called misalignment noise from corrupting the resulting error signal E from each echo canceler. To this end, it is noted that the quality of adaptation of each of adaptive echo cancelers 101 is dependent on the relative portion of error signal E that can be estimated by the adaptive echo canceler. If the error signal or a portion thereof is within the portion of the extended impulse response being modeled by the echo canceler, "good" adaptation results and there is little so-called misalignment noise in error signal E. However, if none of the error signal is caused by the portion of the impulse response being modeled by the particular echo canceler, then the error estimate being generated will be noisy, i.e., there is a greater amount of misalignment noise generated. Misalignment noise is the noise on the impulse response estimate being generated which is reflected in the error signal E after the output signal estimate Ŷ is subtracted from output signal Y. Allowing the individual ones of adaptive echo cancelers 101 to adapt only when in the preferred position minimizes the affect of the noise on the overall adaptation process.

Figure 2:
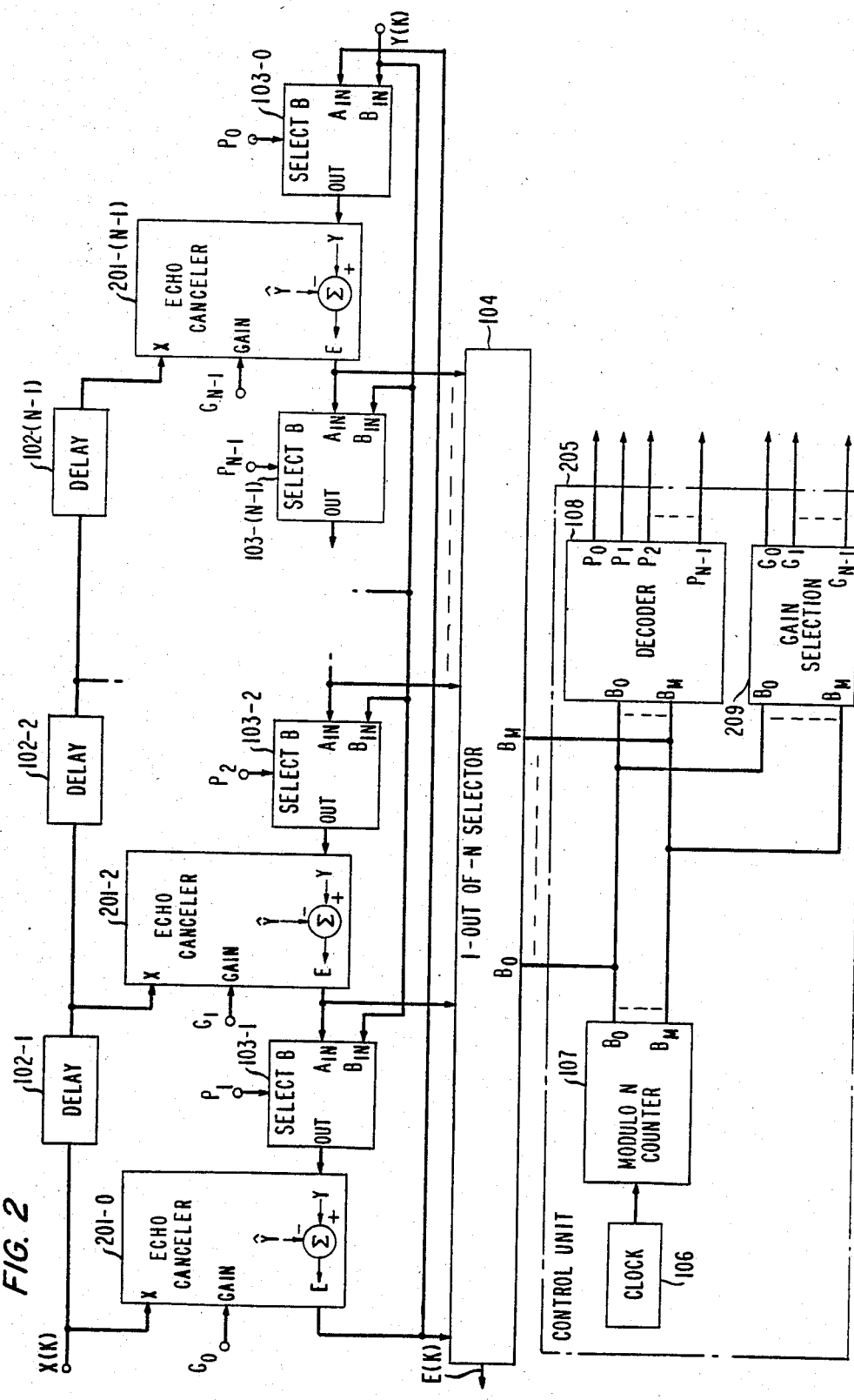
FIG. 2 depicts also in simplified block diagram form a tandem connection of adaptive echo cancelers including another embodiment of the invention.

FIG. 2 shows in simplified block diagram form another embodiment of the invention. The embodiment of FIG. 2 is similar to the embodiment of FIG. 1. Accordingly, elements in the embodiment of FIG. 2 which are identical to those in FIG. 1 have been similarly numbered and will not be discussed again in detail. Indeed, operation of the embodiment of FIG. 2 is identical to that discussed above regarding the continuous switching at the predetermined rate and in the prescribed sequence of the relative positions of adaptive echo cancelers 201-0 through 201-(N-1) in the tandem connection. The difference between the embodiments of FIG. 1 and FIG. 2 is that instead of inhibiting the adaptation of all of adaptive echo cancelers 201 except the one in the preferred or first position in the tandem connection, the ones of adaptive echo cancelers 201 not in the preferred position are allowed to adapt but at a predetermined rate typically slower than the normal adaption rate and determined by the relative positions of the adaptive echo cancelers in the tandem connection, in accordance with an aspect of the invention. This is realized by controlling the tap coefficient update gain via control signals $G_0$ through $G_{N-1}$ generated by gain selection unit 209 in control unit 205. The reason for the varied update gains is that the adaptive echo cancelers in the second or next to the preferred position in the tandem connection is only slightly "less preferred" than the adaptive echo canceler in the preferred or first position and so on through the last adaptive echo canceler in the tandem connection. Consequently, in some applications, it is preferable to let the "less preferred" adaptive echo cancelers still adapt but at a rate slower than the normal or preferred rate rather than inhibiting adaptation entirely. Since some adaptive echo cancelers have selectable update gain, this implementation is readily realizable. To this end, gain control signals $G_0$ through $G_{N-1}$ are supplied from control unit 205 to the GAIN inputs of adaptive echo cancelers 201-0 through 201-(N-1), respectively. As indicated above the normal rate of adaption is a rate obtained by setting the tap coefficient update gain value so that good quality adaptation would result if the adaptive echo canceler was being used in a non-tandem application. As indicated above, one example of a normal adaptation rate is −50 dB/second.

The gains of adaptive echo cancelers 201-0 through 201-(N-1) are controlled in one example by letting G be the normal update gain value. Then, the gain of the adaptive echo canceler in the preferred position is controlled to be a value G which yields the so-called normal rate of adaption. Then, the gain of the adaptive echo canceler next in the tandem connection is controlled to be G/2 and so on until the last adaptive echo canceler has a gain of G/N. This gain control is realized by employing a read-only-memory for gain selection unit 209 programmed to output the appropriate gain control values $G_0$ through $G_{N-1}$ in a prescribed sequence in response to binary bits $B_0$ through $B_M$ from modulo N counter 107. Specifically, letting $G_i$ be the gain value for adaptive echo canceler i in the tandem connection (i=0, 1, 2, . . . , N-1) G being the normal gain for the adaptive echo canceler in the preferred position and j being the preferred adaptive echo canceler position, then $$G_i = \left\lfloor \frac{G}{[(i-j) \text{ modulo } N] + 1} \right\rfloor$$

where the symbol $$\lfloor L \rfloor$$

is the so-called floor function applied to the the function L and yields the smallest integer less than or equal to the function L.

The above arrangements are only examples of embodiments of the invention. It will be apparent to those skilled in the art that various changes in form and detail may be made without departing from the spirit or scope of the invention. Indeed, the adaptive echo cancelers need not be switched continuously, a number of iterations may only be required. Examples of echo cancelers which may be used are the 140AB or 140Y echo canceler manufactured by Western Electric Company in the embodiment of FIG. 1 and the 257U or 257AC echo canceler also manufactured by Western Electric Company in the embodiment of FIG. 2.

What is claimed is:

1. Apparatus including,
    a first adaptive echo canceler having a receive input, a transmit input and a transmit output,
    at least a second adaptive echo canceler having a receive input, a transmit input and a transmit output,
    means for switchably connecting said transmit inputs and transmit outputs of said adaptive echo cancelers in a tandem connection, and
    switching control means for controllably switching said transmit inputs and transmit outputs of said echo cancelers so that the relative positions of said adaptive echo cancelers are effectively switched in said tandem connection, said apparatus characterized in that,
    said switching control means controllably switching said transmit inputs and transmit outputs of said echo cancelers so that the relative positions of said adaptive echo cancelers are switched in said tandem connection at a predetermined rate.

2. The apparatus as defined in claim 1 wherein said switching control means further includes means for switching said transmit inputs and said transmit outputs of said echo cancelers so that the relative positions of said adaptive echo cancelers are effectively switched in said tandem connection in a prescribed sequence at said predetermined rate continuously.

3. The apparatus as defined in claim 1 wherein each of said adaptive echo cancelers includes means responsive to control signals for inhibiting adaptation, and wherein said switching control means further includes means for generating said control signals to enable adaptation of one of said adaptive echo cancelers in a predetermined position in said tandem connection and to disable adaptation of the other adaptive echo cancelers in other positions in said tandem connection.

4. The apparatus as defined in claim 1 wherein each of said adaptive echo cancelers includes means responsive to control signals for controlling the rate of adaptation, and wherein said switching control means further includes means for generating said control signals to control the adaptation rates of said adaptive echo cancelers in accordance with the relative position of each of said adaptive echo cancelers in said tandem connection.

5. The apparatus as defined in claim 4 wherein said adaptation rate controlling means includes means responsive to the control signal for controllably adjusting the tap coefficient update gain of the corresponding adaptive echo canceler, and wherein said switching control means includes means for generating said update gain control signals in accordance with prescribed criteria dependent on the relative positions of said adaptive echo cancelers in said tandem connection.

6. The apparatus as defined in claim 5 wherein said update gain control signals are generated so that the update gain of one of said adaptive echo cancelers in a predetermined position in said tandem connection is adjusted so that the one of said adaptive echo cancelers adapts at a normal rate and the update gains of the other adaptive echo cancelers are adjusted so that said other echo cancelers adapt at predetermined rates slower than the normal rate and determined in accordance with the relative positions of the adaptive echo cancelers in said tandem connection.

7. Apparatus comprising:
    a plurality of adaptive echo cancelers, each including a receive input, a transmit input and a transmit output;
    means for switchably connecting said transmit inputs and transmit outputs of said plurality of adaptive echo cancelers in a tandem arrangement; and
    means for controlling switching of said transmit inputs and transmit outputs of said adaptive echo cancelers so that the relative positions of said adaptive echo cancelers are switched in said tandem arrangement at a predetermined rate.

8. The apparatus as defined in claim 7 wherein said switchably connecting means includes means in circuit with said adaptive echo canceler transmit inputs and transmit outputs and being responsive to control signals for switching said transmit inputs and transmit outputs so that the relative positions of said adaptive echo cancelers are switched in said tandem connection, and said switching controlling means includes means for generating said control signals at a predetermined rate.

9. The apparatus as defined in claim 8 wherein said control signal generating means includes means for generating said control signals at a predetermined rate continuously.

10. The apparatus as defined in claim 9 wherein means for delaying supplying a received signal is connected in circuit with the receive input of all but one of said plurality of adaptive echo cancelers so that each of said adaptive echo cancelers models a predetermined fixed portion of an impulse response characteristic to be generated.

11. The apparatus of claim 10 wherein each of said adaptive echo cancelers includes means for controllably inhibiting adaptation, and wherein said switching controlling means generates control signals for enabling adaptation of one of said adaptive echo cancelers in a predetermined position in said tandem arrangement and for disabling adaptation of the other adaptive echo cancelers in said tandem arrangement.

12. The apparatus as defined in claim 10 wherein each of said adaptive echo cancelers includes means responsive to a control signal for adjusting its rate of adaptation and wherein said switching controlling means further includes means for generating control signals for adjusting the rates of adaptation of said adaptive echo cancelers dependent on the relative positions of said adaptive echo cancelers in said tandem arrangement.

13. The apparatus as defined in claim 12 wherein said switching controlling means generates a plurality of adaptation rate control signals equal in number to said plurality of adaptive echo cancelers, one of said control signals adjusts the adaptive echo canceler in a predetermined position in said tandem arrangement to adapt at a normal rate, and the other control signals adjust corresponding ones of the other ones of said adaptive echo cancelers to adaptation rates less than the normal rate and determined in accordance with the relative positions of said adaptive echo cancelers in said tandem connection.

* * * * *